United States Patent [19]
Viggiano et al.

[11] Patent Number: 6,129,040
[45] Date of Patent: Oct. 10, 2000

[54] SEMI-CONDUCTOR MOUNTING APPARATUS FOR APPLYING ADHESIVE TO A SUBSTRATE

[75] Inventors: Franco Viggiano, Cham; Christof Koster, Allenwinden, both of Switzerland

[73] Assignee: Esec SA, Cham, Switzerland

[21] Appl. No.: 09/136,790

[22] Filed: Aug. 19, 1998

[30] Foreign Application Priority Data

Sep. 5, 1997 [CH]  Switzerland ............................ 2089/97

[51] Int. Cl.$^7$ ................................. B05B 3/00; B05D 5/10
[52] U.S. Cl. ...................... 118/323; 427/96; 427/208.6; 427/287
[58] Field of Search .................... 427/96, 208.2, 427/208.6, 287; 438/118; 156/87, 295; 118/323, 697, 698

[56] References Cited

U.S. PATENT DOCUMENTS

| | | | |
|---|---|---|---|
| Re. 34,615 | 5/1994 | Freeman | 348/95 |
| 3,337,941 | 8/1967 | Drop | 29/203 |
| 4,144,449 | 3/1979 | Funk et al. | 250/221 |
| 4,346,293 | 8/1982 | Fetzer | 250/222 R |
| 4,351,264 | 9/1982 | Fluam et al. | 118/203 |
| 4,378,134 | 3/1983 | Eddy | 308/3.5 |
| 4,383,359 | 5/1983 | Suzuki et al. | 29/712 |
| 4,584,047 | 4/1986 | Vanderpool et al. | 156/361 |
| 4,610,083 | 9/1986 | Campisi et al. | 29/832 |
| 4,615,093 | 10/1986 | Tews et al. | 29/407 |
| 4,819,326 | 4/1989 | Stannek | 29/837 |
| 4,868,007 | 9/1989 | Taguchi | 427/96 |
| 4,915,770 | 4/1990 | Haeda et al. | 156/344 |
| 4,934,891 | 6/1990 | Hawkswell | 414/223 |
| 4,937,511 | 6/1990 | Herndon et al. | 318/568.21 |
| 5,023,544 | 6/1991 | Vallone et al. | 324/158 F |
| 5,024,720 | 6/1991 | Boss et al. | 156/584 |
| 5,086,559 | 2/1992 | Akatsuchi | 29/834 |
| 5,150,423 | 9/1992 | Hoki | 382/8 |
| 5,157,617 | 10/1992 | Ramsey | 364/478 |
| 5,157,734 | 10/1992 | Chen et al. | 382/8 |
| 5,191,693 | 3/1993 | Umetsu | 29/429 |

(List continued on next page.)

FOREIGN PATENT DOCUMENTS

| | | | |
|---|---|---|---|
| 0 236 225 | 9/1987 | European Pat. Off. | H05K 13/02 |
| 0 462 596 A1 | 12/1991 | European Pat. Off. | H01L 21/00 |
| 0 476 577 A2 | 3/1992 | European Pat. Off. | H05K 13/00 |
| 29 39 102 | 9/1979 | Germany | B05C 1/08 |
| 3-0086655 | 1/1991 | Japan | B65H 26/00 |
| 3-133763 | 6/1991 | Japan | B65D 73/02 |
| 5-145283 | 6/1993 | Japan | H05K 13/02 |
| 6-089910 | 3/1994 | Japan | H01L 21/52 |
| 8-340175 | 12/1996 | Japan | H05K 3/34 |
| 9-064094 | 3/1997 | Japan | H01L 21/60 |
| 2 111 863 | 12/1981 | United Kingdom | B05B 13/00 |
| 2 183 820 | 6/1987 | United Kingdom | G05D 3/10 |
| 2 111 863 | 7/1993 | United Kingdom | B05B 13/00 |

OTHER PUBLICATIONS

Gore, et al., Fluxing Tool Incorporated Into Part Feeder; Specifically for Assembly of C–5 Chip Carriers, Motorola Inc., Technical Developments, vol. 13, Jul. 1991, pp. 36–37.

*Primary Examiner*—Shrive Beck
*Assistant Examiner*—Jennifer Calcagni
*Attorney, Agent, or Firm*—D'Alessandro & Ritchie

[57] ABSTRACT

An apparatus for applying an adhesive pattern to a chip mounting surface by means of an adhesive dispensing head movable in z, y, and z dimensions, contains a first carriage, which is movable in x and y dimensions using first and second actuators. A second carriage with a dispensing head is movable in the z dimension, perpendicular to the chip mounting surface, on a guide mounted on the first carriage. A third actuator is provided with a positioning motor mounted in a stationary manner and an auxiliary carriage displaceable in the z direction. The auxiliary carriage, driven by the positioning motor, runs in a stationary guide. The auxiliary carriage has a positioning surface parallel to the chip mounting surface and a stop, the stop kept in constant contact with the positioning surface. Preferably, this contact is a gliding contact retained by a spring. The apparatus has good dynamic properties which make possible a rapid "drawing" of adhesive patterns with a high degree of precision.

8 Claims, 3 Drawing Sheets

U.S. PATENT DOCUMENTS

| | | | |
|---|---|---|---|
| 5,195,234 | 3/1993 | Pine et al. | 29/720 |
| 5,213,653 | 5/1993 | Akahori et al. | 156/584 |
| 5,248,362 | 9/1993 | Sissons | 156/205 |
| 5,249,239 | 9/1993 | Kida | 382/8 |
| 5,275,657 | 1/1994 | Duffy et al. | 118/224 |
| 5,278,634 | 1/1994 | Skunes et al. | 356/400 |
| 5,289,625 | 3/1994 | Umetsu et al. | 29/426.3 |
| 5,309,223 | 5/1994 | Konicek et al. | 356/375 |
| 5,311,304 | 5/1994 | Monno | 348/87 |
| 5,342,460 | 8/1994 | Hidese | 156/64 |
| 5,380,099 | 1/1995 | Teramachi | 384/45 |
| 5,400,497 | 3/1995 | Watanabe et al. | 29/705 |
| 5,415,693 | 5/1995 | Yoneda et al. | 118/664 |
| 5,455,409 | 10/1995 | Smith et al. | 235/385 |
| 5,459,794 | 10/1995 | Ninomiya et al. | 382/145 |
| 5,475,919 | 12/1995 | Wu et al. | 29/841 |
| 5,488,771 | 2/1996 | Devitt et al. | 29/898.02 |
| 5,499,756 | 3/1996 | Banerji et al. | 228/214 |
| 5,515,600 | 5/1996 | Iwasaki et al. | 29/740 |
| 5,547,537 | 8/1996 | Reynolds et al. | 156/351 |
| 5,553,376 | 9/1996 | Solanki et al. | 29/833 |
| 5,559,727 | 9/1996 | Deley et al. | 364/559 |
| 5,562,384 | 10/1996 | Alvite et al. | 414/222 |
| 5,564,188 | 10/1996 | Akasako et al. | 29/898.03 |
| 5,592,562 | 1/1997 | Rooks | 382/150 |
| 5,650,081 | 7/1997 | Hudson | 219/229 |
| 5,669,970 | 9/1997 | Balog et al. | 118/213 |
| 5,694,443 | 12/1997 | Stone et al. | 377/6 |
| 5,708,419 | 1/1998 | Isaacson et al. | 340/572 |
| 5,713,125 | 2/1998 | Watanabe et al. | 29/833 |
| 5,715,594 | 2/1998 | Patterson et al. | 29/842 |
| 5,735,040 | 4/1998 | Ochi et al. | 29/841 |
| 5,788,379 | 8/1998 | Reeve | 384/41 |
| 5,829,689 | 11/1998 | Tadao et al. | 239/750 |
| 5,838,754 | 11/1998 | Olson et al. | 364/478.07 |
| 5,885,052 | 3/1999 | Tsuji et al. | 414/744.6 |
| 5,941,674 | 8/1999 | Briehl | 414/417 |

SEMI-CONDUCTOR MOUNTING APPARATUS FOR APPLYING ADHESIVE TO A SUBSTRATE

PRIORITY CLAIM

The present application claims priority under 35 U.S.C. § 119 based upon Swiss application no. 2089/97, filed Sep. 5, 1997.

BACKGROUND OF THE INVENTION

1. Field of the Invention

The invention relates to a semi-conductor mounting apparatus for applying adhesive to a substrate in the area of a chip mounting surface.

2. The Background Art

The widespread practice of mounting semiconductor chips using adhesive (usually epoxy-based) assumes a metered application of the adhesive in a certain distribution on the mounting surface so that when the chip is subsequently applied, there is a layer of adhesive spread as evenly as possible over the entire surface of the chip, free from trapped air. In order to obtain this, different "figurative" patterns of application are used, ranging from a simple diagonal cross to line patterns with a plurality of branches, according to the format of the chip, type of adhesive and further parameters.

Within an automated mounting mechanism, known as a "die bonder", a particular apparatus is used for the application of adhesive. This apparatus moves a dispenser over the substrate. The desired pattern of application can thus be produced in different ways. For example, a die-type dispensing tool may be used, which has a large number of nozzles arranged in rows corresponding to the pattern (a "multitube dispenser"). Such tools must be individually manufactured and changed for each pattern. Another application apparatus that may be used has a single nozzle, which is guided over the substrate in a programmed movement corresponding to the pattern and thus "draws" the pattern of lines (a "programmable dispenser"). A considerable advantage of this apparatus is in that any pattern can be produced using the same, relatively simple tool, simply by amending the software. Nevertheless, it is necessary to carry out the programmed movements with sufficient precision, and above all at high speed, so that even branched patterns can be "drawn" with short cycle times.

Known apparatus of the type described above have the following features:

- an adhesive dispensing head moveable in three coordinate dimensions (x, y, z)
- a first carriage which is moveable in two dimensions (x, y) parallel to the mounting surface using associated first and second actuators, and
- a second carriage which is moveable on a guide connected to the first carriage, in the third dimension (z) perpendicular to the mounting surface using a third actuator, and which carries the dispensing head.

One of the known embodiments is a "standard" three-axis control unit with three overlying carriages, each provided with an actuator, and in another case although the x and y actuators of the first carriage are not coupled together, the third (z) actuator together with its carriage is mounted on the first x/y carriage and is moved along with it. With such apparatus according to the prior art, it is difficult to obtain the required mechanical stability and precision of control over the whole three-axis working surface. Above all, however, the acceleration and speeds of the controlling movements obtainable are limited because the weight of powerful positioning motors in turn requires correspondingly stable carriage guides, which as a whole results in ever greater masses being moved.

The object of the invention is to overcome the disadvantages and limitations of the prior art, and to improve the dynamic properties of such apparatus in order to obtain faster accelerations and control speeds of the dispensing head and thereby shorter cycle times for "drawing" the pattern of adhesive.

BRIEF DESCRIPTION OF THE INVENTION

An apparatus for applying an adhesive pattern to a chip mounting surface using an adhesive dispensing head movable in z, y, and z dimensions, contains a first carriage, which is movable in x and y dimensions using first and second actuators. A second carriage with a dispensing head is movable in the z dimension, perpendicular to the chip mounting surface, on a guide mounted on the first carriage. A third actuator is provided with a positioning motor mounted in a stationary manner and an auxiliary carriage displaceable in the z direction. The auxiliary carriage, driven by the positioning motor, runs in a stationary guide. The auxiliary carriage has a positioning surface parallel to the chip mounting surface and a stop, the stop kept in constant contact with the positioning surface. Preferably, this contact is a gliding contact retained by a spring. The apparatus has good dynamic properties which make possible a rapid "drawing" of adhesive patterns with a high degree of precision.

BRIEF DESCRIPTION OF THE DRAWING FIGURES

DETAILED DESCRIPTION OF THE INVENTION

Figure 1:
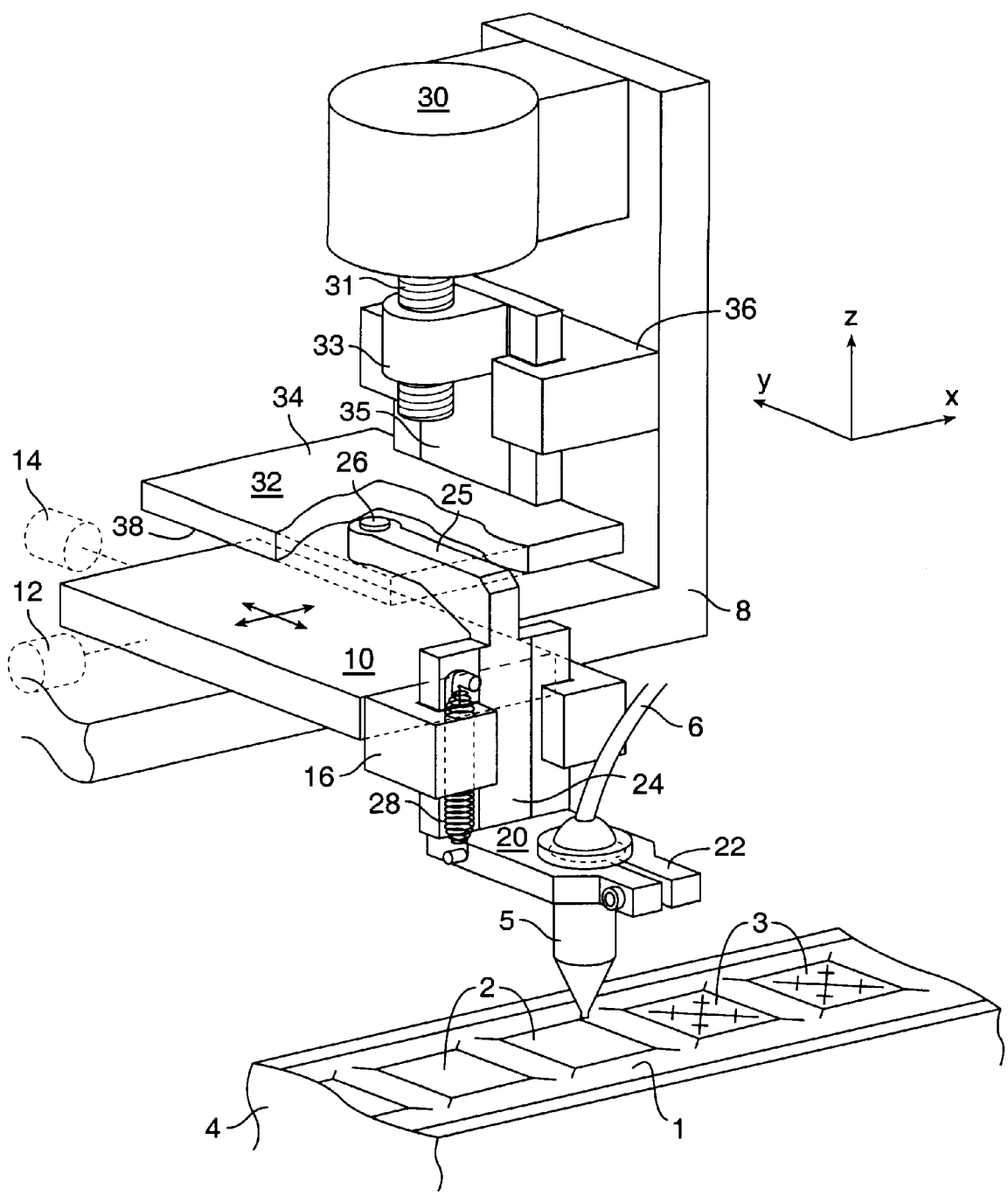
FIG. 1 is a diagram illustrating a perspective view of a first embodiment of the semiconductor mounting apparatus, with an indication of the three coordinate dimensions.

FIG. 1 is a diagram of a perspective view of the semiconductor mounting apparatus, with an indication of the three coordinate dimensions. The apparatus may be constructed as a component of a die bonder on a stationary base structure 8. In the die bonder, in a manner known in the art, a substrate 1, for example a metallic, strip-shaped "lead frame", is advanced stepwise in the direction of the arrow on a backing 4 using a transport device (not shown) .The substrate 1 contains chip mounting surfaces 2 (also known as "chip islands"), to each of which an adhesive pattern 3 is applied using a dispensing head 5 moveable in three coordinate dimensions, x, y and z. The flowable adhesive, typically epoxy-based, is supplied using a flexible line 6 and metered, for example, by using a known volumetric pump (not shown). In a known manner, the substrate 1, further advanced in the die bonder, then has a chip placed on each adhesive pattern 3, whereby the adhesive spreads over the surface of the chip and bonds it to the substrate.

The adhesive is often applied as a branched line pattern going from the diagonals of the mounting surface 2. For this, the dispensing head 5 must be moved in a programmed sequence in the x and y directions, while the dispenser aperture is kept at a precisely predetermined distance above the mounting surface 2. When the line is interrupted, and also when the substrate is moved, the dispensing head must be lifted up (dimension z). All these movements must be carried out with a high degree of precision and be done as quickly as possible to obtain short cycle times.

A first carriage 10 mounted on the base 8, with associated (first and second) actuators 12 and 14, serves to move the dispensing head 5 in directions x and y, parallel to the respective mounting surface 2. These components are only shown schematically and could be produced in different ways, known per se. There could be, for example, a compound table with longitudinal and cross carriages (wherein, for example, only the x actuator is mounted in a stationary manner, and the y drive travels with it in direction x). Preferably, however, the x and y directions are not "coupled" and both the drives 12 and 14 are stationary.

Connected to the carriage 10 is a guide 16, which guides a second carriage 20 displaceable in the dimension z, perpendicular to the mounting surface 2. The substantially corner-shaped carriage 20 has one arm arranged at 22 for retaining the removable dispensing head 5, while the other arm 24 is provided with guide ways running into the guide 16.

The following arrangement serves as the third actuator, used for the movements of the carriage 20 in the direction z:

A positioning motor 30 is mounted in a stationary manner on the base 8. An auxiliary carriage 32, driven by the motor 30, is moveable in a guide 36, which is also stationary, in the z direction, perpendicular to the mounting surface 2. In the present example, a spindle mechanism is provided as the drive connection, with a screw spindle 31 which engages without clearance in the nut 33 on the auxiliary carriage 32. The latter is provided with a horizontal arm 34 and a vertical arm 35 sliding in the guide 36. The underside of the horizontal arm forms a positioning surface 38 which is machined to be exactly planar and is aligned parallel to the mounting surface 2 of the substrate 1 (and respectively to the supporting surface of the substrate backing 4). The extension of the positioning surface 38 corresponds to at least the range of travel of the carriage 10 in the x and y directions and to the operating area of the dispensing head 5, respectively. A stop 25, 26 provided on the carriage 20, kept constantly in contact with the positioning surface 38, cooperates with said positioning surface 38. Permanent contact is ensured from below using a tension spring 28, which is tensioned between the carriage 20 and its guide 16.

As shown, the stop is configured here as a gliding head with a (preferably replaceable) insert 26 made of gliding material which glides over the positioning surface 38. By suitable selection of the gliding material (for example, a graphite based solids mixture) and/or of the pairing of materials, it is ensured that the positioning surface 38 is not subject to wear. It is also conceivable to construct the stop with a rolling ball or the like instead of with a gliding head.

During operation of the apparatus depicted in FIG. 1, the programmed, rapid "writing" movements of the dispensing head 5 in dimension x and y are carried out by the actuators 12 and 14 via the carriage 10. The height position of the head 5 (z dimension value) is then given by the position of the auxiliary carriage 32 via the stop 25, 26. Apart from the head 5, the carriage 10 has only to move the relatively light carriage 20, unencumbered by the actuator in the z dimension, as the motor 30 and the auxiliary carriage 32 are mounted in a stationary manner and consequently no acceleration forces occur on the carriage 20 resulting from their mass.

For the vertical movements of the carriage 20 with the head 5, the motor 30 must (additionally) move the auxiliary carriage 32 and overcome the force of the spring 28. With the motor 30 mounted in a stationary manner, this can be managed without any particular problems. Taking dynamics into account, and for adjusting the z dimension position, constant contact of the gliding insert 26 with the positioning surface 38 must be ensured. In the arrangement described, stopping of the carriage 20 after rapid lowering to the specified height is crucial. With regard to this, it is advantageous that the force of the tension spring 28 increases with lower positions of the carriage 20, and thus more strongly counters the tendency of the surface 38 to rise up.

The dispensing head 5 is replaceable, as described above. In particular, the apparatus can be operated with a die-type ("multitube") head instead of with a "writing" dispensing head according to FIG. 1. Such a "multitube" head generally necessitates movements only in the z dimension (but in x and y if necessary, for centering the head over the mounting surface 2 or for temporary removal from the operating position). In order to take into account the different sizes of dispensing heads, the spring 28 may be replaced or the pre-tensioning thereof adjusted.

Figure 2:
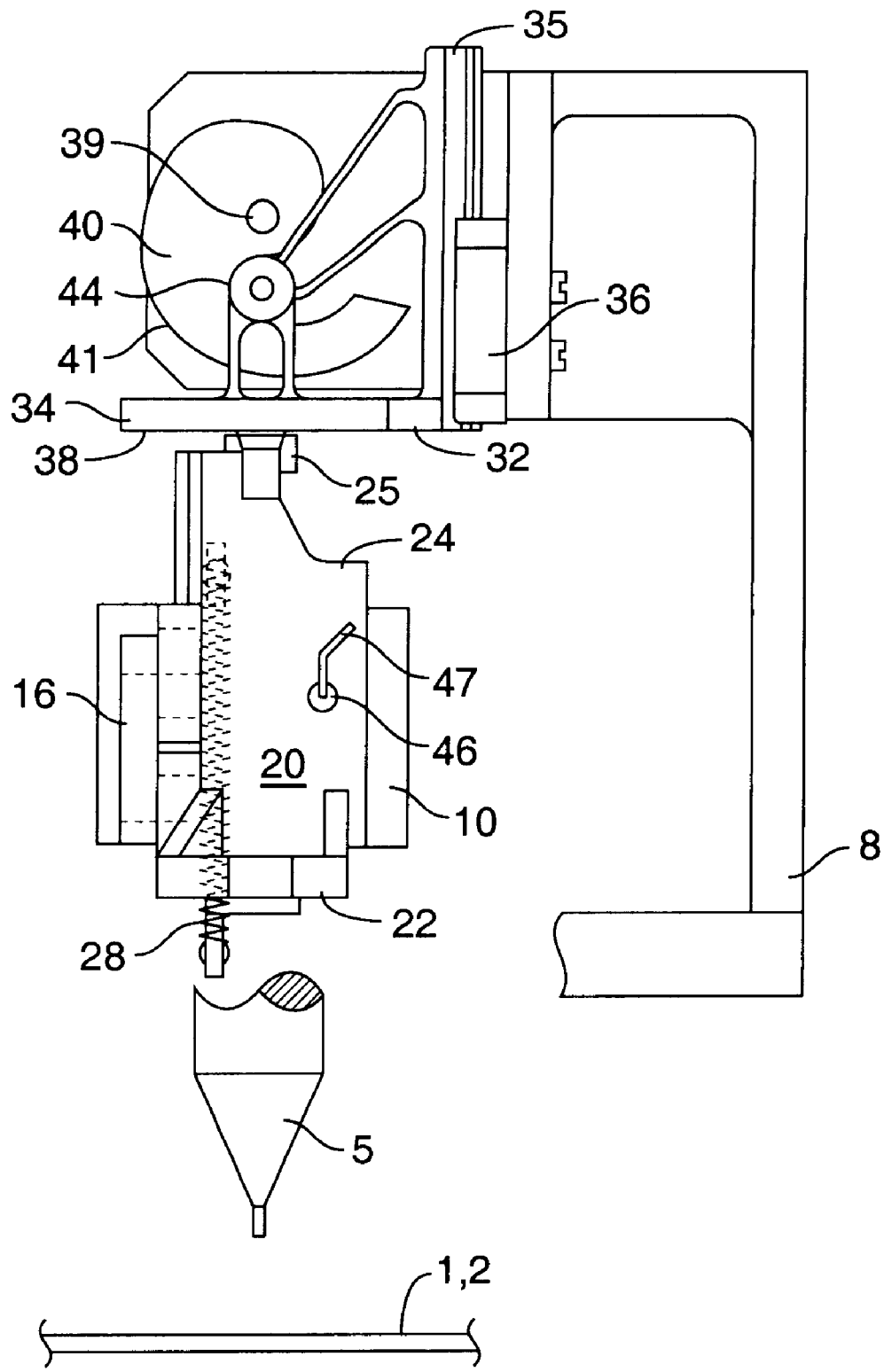
FIG. 2 is a diagram illustrating a side view of a second embodiment of the semiconductor mounting apparatus, as seen along the y dimension.
Figure 3:
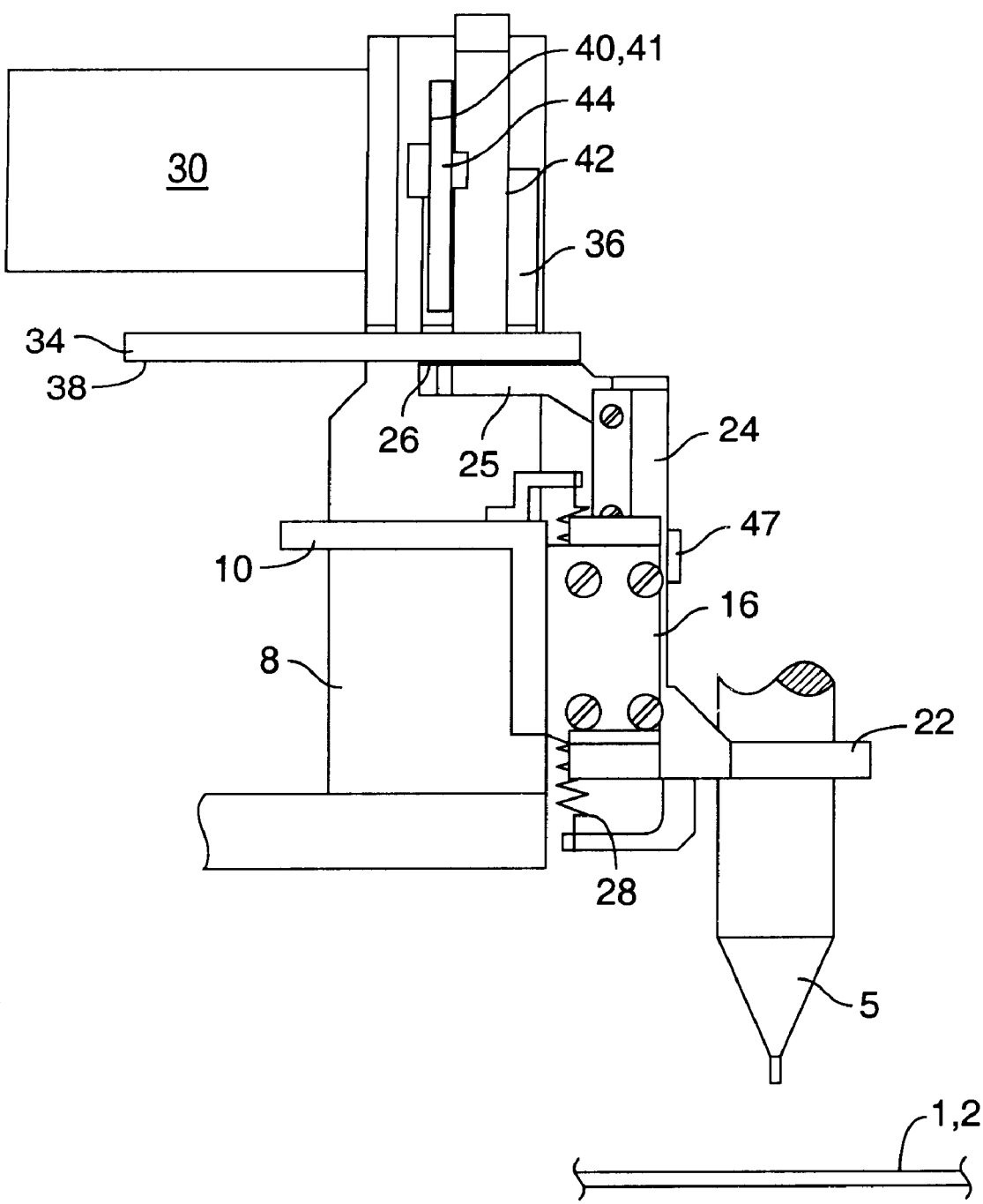
FIG. 3 is a diagram illustrating a side view of the second embodiment of the semiconductor mounting apparatus, as seen along the x dimension.

FIG. 2 is a diagram illustrating a side view of a second embodiment of the semiconductor mounting apparatus, as seen along the y dimension. FIG. 3 is a diagram illustrating a side view of the second embodiment of the semiconductor mounting apparatus, as seen along the x dimension. Those parts in FIGS. 2–3 which have the same function as parts in FIG. 1 are given the same references as in FIG. 1, even when they are somewhat differently configured or arranged. The actuators and the mounting of the x-y carriage 10 are not shown further.

With the apparatus according to FIGS. 2 and 3, it is above all the drive connection between the positioning motor 30 and the auxiliary carriage 32 which is solved differently than in FIG. 1.

A cam plate 40 is mounted in a torsion resistant manner on the rotor shaft 39 of the motor 30. A roller head 44 cooperates with the cam 41 of the cam plate, the roller head 44 being mounted on an axle bolt 42 held in the auxiliary carriage 32. The clearance-free resting of the roller head 44 on the cam 41 is maintained in this case by the force of the spring 28 which transfers via the gliding insert 26 to the auxiliary carriage 32 and thereby to the roller head 44. It would also be possible, however, to provide a separate spring tensioned between the auxiliary carriage 32 and the base structure 8 for this purpose.

A direct current motor or a stepping motor of a known construction are particularly suitable as the positioning motor 30 (this is also the case with the x and y positioning motors 12 and 14, FIG. 1). As, in the arrangement described, the bearing force of the roller head 44 on the rising cam 41 effects a torque on the rotor axle 39, a corresponding counter-torque must be applied by the motor 30 in order to be able to maintain a particular z dimension position. As small a rise as possible of the cam 41 should be provided for a low motor holding torque. In this connection, a linear spiral has proved advantageous for the cam (radius increasing with the angle of rotation). As may be seen in FIG. 2, it is advantageous to have the spiral extend over more than 360°, in order to produce the necessary lift stroke in the z direction with a small degree of rise.

As the spring 28 stretches increasingly, with lower positions of the carriage 20, the force of the spring, and thereby the supporting power of the roller head 44 on the cam 41, increases. A corresponding increase in the motor holding torque necessary is, however, partially compensated for in that with the spiral described, the angle between the tangent thereof and the radius becomes smaller as the radius increases. When dimensioning the cam 41 and the spring 28, care should be taken that during all accelerations of the carriage 20 with the dispensing head 5 during operation, the contact between the stop 25, 26 and the positioning surface 38 is maintained.

The incorporation of a sensor 46 with measuring line 47 on the carriage 20, in the arm 24, is shown in FIG. 2. These are components of a measuring arrangement known in the art and not shown in further detail, for continuous determination of the position of the carriage in the z dimension (for example, a photo-transistor as a pulse generator together with a glass measuring rod incorporated into the guide 16; naturally the reverse arrangement is also possible). A measuring arrangement at this site is particularly advantageous as an actual value sensor in a position control loop for controlling the actuating motor 30, in that it measures directly "right up front" the z dimension position of the dispenser aperture (after calibration according to the height of the substrate 1). By virtue of the feedback control of the z position of the carriage 20, or alternatively of the positioning surface 38, using the signals from the sensor 46, any possible wear of the gliding head is compensated for.

The apparatus may also be used for applying adhesive with a die, without writing movements of the dispensing head, in the x and/or y dimension, to the chip mounting surface 2. For this usage, an adjustment mechanism, not shown, is provided with which the base structure 8 is adjustable such that the edges of the die are plane-parallel to the chip mounting surface 2 and therefore lie in a form-fitting manner on the chip mounting surface.

What is claimed is:

1. A semiconductor mounting apparatus for applying adhesive to a chip mounting surface on a substrate, including:

an adhesive dispensing head;

a first actuator;

a second actuator;

a third actuator;

a first carriage movable in a first dimension parallel to the chip mounting surface using said first actuator and movable in a second dimension parallel to the chip mounting surface using said second actuator;

a guide, said guide connected to said first carriage and running in a third dimension perpendicular to said chip mounting surface;

a second carriage connected to said guide and moveable along said guide in the third dimension using said third actuator, said second carriage carrying said adhesive dispensing head;

said third actuator having a positioning motor mounted in a stationary manner and an auxiliary carriage driven by said motor, said auxiliary carriage attached to a stationary guide and moveable along said stationary guide in the third dimension, said auxiliary carriage further having a positioning surface parallel to said chip mounting surface; and said second carriage having a stop, wherein said stop cooperates with said positioning surface of said auxiliary carriage and which is kept in constant contact with said positioning surface of said auxiliary carriage.

2. The semiconductor mounting apparatus of claim 1, wherein said positioning surface is formed by the underside of said auxiliary carriage facing the substrate, and said stop is held from below against said positioning surface using a spring tensioned between said second carriage and said guide.

3. The semiconductor mounting apparatus of claim 1, wherein said stop is formed by a gliding head and is provided with an insert made from gliding material which ensures gliding movements along said positioning surface without abrasion of said surface.

4. The semiconductor mounting apparatus of claim 2, wherein said stop is formed by a gliding head and is provided with an insert made from gliding material which ensures gliding movements along said positioning surface without abrasion of said surface.

5. The semiconductor mounting apparatus of claim 1, wherein said third actuator comprises a cam plate driven by said positioning motor and a roller head mounted on said auxiliary carriage cooperating with the cam of said cam plate.

6. The semiconductor mounting apparatus of claim 5, wherein said cam is a spiral and its angle of rotation extends over more than 360 degrees.

7. The semiconductor mounting apparatus of claim 6, wherein said spiral is a linear spiral.

8. The semiconductor mounting apparatus of claim 1, further comprising path measuring means located on said second carriage, said path measuring means used to determine the actual position of the second carriage in the third dimension perpendicular to the chip mounting surface.

* * * * *